United States Patent [19]

Foster

[11] 3,846,791

[45] Nov. 5, 1974

[54] SOLID STATE KEYBOARD

[76] Inventor: Richard C. Foster, 11750 Eight Mile Rd., Stockton, Calif. 95207

[22] Filed: Oct. 2, 1972

[21] Appl. No.: 294,038

[52] U.S. Cl. .......... 340/365 C, 317/101 C, 307/308

[51] Int. Cl. .......... H04l 15/06

[58] Field of Search .......... 340/365 C; 178/17 D; 197/90 K; 200/DIG. 1; 328/5; 307/308; 317/101 C

[56] References Cited

UNITED STATES PATENTS

| | | | |
|---|---|---|---|
| 3,492,440 | 1/1970 | Cerbone et al. | 340/365 C |
| 3,696,409 | 10/1972 | Braaten | 340/365 C |
| 3,701,869 | 10/1972 | Jacob et al. | 340/365 C |
| 3,725,907 | 4/1973 | Boulanger | 340/365 A |
| 3,772,685 | 11/1973 | Masi | 340/365 C |

*Primary Examiner*—Thomas B. Habecker
*Attorney, Agent, or Firm*—Townsend and Townsend

[57] ABSTRACT

A solid state keyboard having an array of immobile metal key-representing contacts on an insulative board. The contacts may be formed in the shape of the alphanumeric character or other indicia to be associated therewith. The rear surface of the board may include suitable electronic circuitry, preferably in the form of integrated circuits connected to the contacts by printed circuit traces and plated through holes. The electronic circuitry includes a signal source adapted to supply a high frequency electrical signal to the contacts and threshold detectors connected to each of the contacts. When the finger of the operator makes conductive contact with one of the contacts, the signal level applied to the threshold detector will be reduced, actuating the threshold detector to achieve the desired electronic switching.

9 Claims, 6 Drawing Figures

SOLID STATE KEYBOARD

This invention relates to solid state keyboards, and more particularly, to a solid state keyboard having immobile key-representing contacts.

Historically, electronic keyboards have comprised an array of mechanical switches actuated by keys. Such keyboards are prone to malfunction primarily due to switch contact deterioration. In order to remedy this shortcoming, a myriad of different electronic keyboard schemes have been developed. Among these electronic keyboard schemes, there have been attempts to produce an electronic keyboard employing immobile key-representing areas, wherein the touch and/or proximity of a human finger to the key-representing area is electronically detected.

Such prior attempts at immobile keyboards may generally be characterized as one of three types. The first type comprises an array of proximity switches. The principal drawback of such keyboards is that there is a reasonable possibility that the operator's fingers will inadvertently actuate undesired switches, and may in fact actuate several switches simultaneously. Such inaccuracy obviously renders these keyboards undesirable.

The second type of immobile electronic keyboard comprises an array of pairs of contacts. The operator's finger must make electrical contact with both contacts of a pair, to complete an electrical circuit there between, in order to actuate a key. Use of contact pairs produces a substantial likelihood of error as it is possible to inadvertently fail to make good electrical contact to both contacts simultaneously.

A third type of immobile keyboard consists of an array of individual contacts connected to electronic circuitry adapted to detect the presence of a small 60 Hertz signal induced in the body of the operator by the field of the electrical wiring of the building, when the operator's finger contacts the contact. The principal drawback of such keyboards results from the wide variation in the measured parameter, namely, the 60 Hz signal induced in the operator, due to variations in the field strength at the site of the keyboard, the contact resistence, and the like. Moreover, the 60 Hz signal severely limits the operating speed of the circuitry.

These and other drawbacks are overcome by the immobile solid state keyboard of the present invention. Specifically, there is provided an insulative, printed circuit-type board having an array of immobile key-representing metal contacts on the upper surface thereof. The contacts are connected to electronic circuitry including a high frequency signal source and a plurality of threshold detectors, one detector being connected to each contact. When the operator's finger makes electrical contact with one of the contacts, the high frequency signal at the input of the associated detector will diminish due to the loading of the signal by the operator as a large free body capacitance. The detector detects such change in signal level to produce the desired electronic switching action in response thereto.

According to a preferred embodiment, the contacts may be formed in the shape of the desired alphanumeric character or other indicia to be associated with each key. The electronic circuitry may be carried on the bottom side of the board in the form of one or more integrated circuits connected to the contacts via printed circuit traces on the bottom surface of the board and plated-through holes to the contacts.

The keyboard according to the present invention is advantageous in that conductive contact with the operator's finger is required, thereby minimizing the spurious characters often produced by proximity switch keyboards. However, single key-representing contacts are employed, thereby simultaneously eliminating the problem of omitted characters, typically associated with paired contact keyboards. Furthermore, the measured parameter, namely, the high frequency signal, is a controlled amount of a known frequency, permitting the effects of the static charge and/or 60 Hz of the body of the operation to be reduced. Greater operating speeds are thus enabled, as the circuitry need not wait for the dissipation of the static charge in the body. The keyboard of the present invention thus achieves a greater degree of accuracy, reliability, and speed than prior immobile keyboards. While an internal signal source is employed, the generation of interference is minimized due to the large impedance connected to the output of the signal source. In addition, the electronic keyboard according to the present invention is substantially invulverable to environmental damage, and is relatively simple, inexpensive, and easy to fabricate.

Accordingly, it is an object of the present invention to provide an improved mechanical configuration for an electronic keyboard having immobile, key-representing contacts.

Another object of the present invention is to provide improved electronic circuitry for an electronic keyboard having immobile, key-representing contacts.

Yet another object of the present invention is to provide an electronic keyboard having immobile, key-representing contacts in which a high frequency electrical signal is applied to the contacts, and the dissipation of the signal produced by the touch of the operator's finger is detected.

Still another object of the present invention is to provide a one-transistor avalanche detector suitable for use in an electronic keyboard or other applications.

These and other objects, features, and advantages of the present invention will be more readily apparent from the following detailed description, wherein reference is made to the accompanying drawings, in which.

Figure 1:
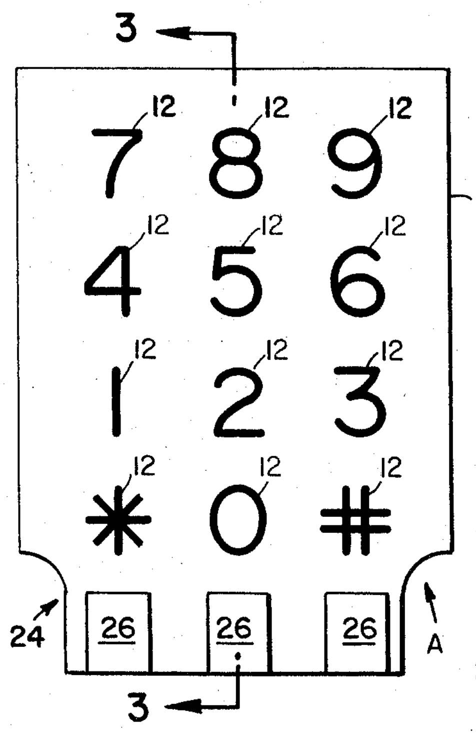
FIG. 1 is a top view of a preferred embodiment of the electronic keyboard according to the present invention.
Figure 3:
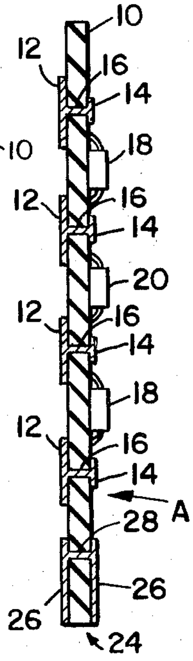
FIG. 3 is a sectional view taken along the line 3—3 in FIG. 1.
Figure 2:
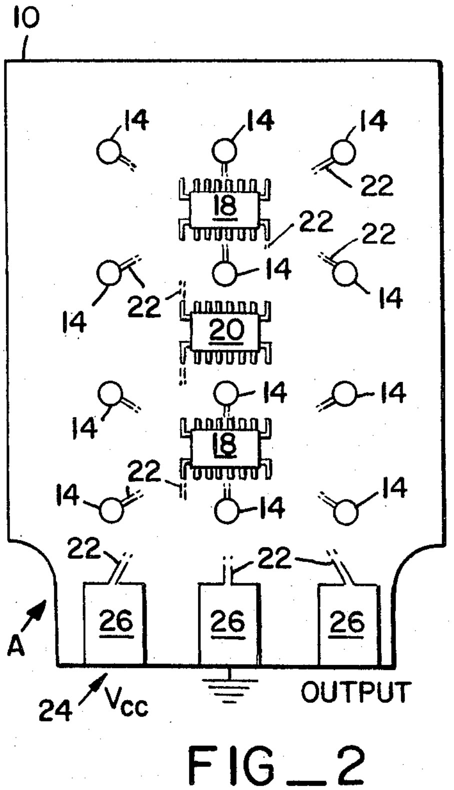
FIG. 2 is a bottom view of the apparatus depicted in FIG. 1.

Referring initially to FIGS. 1–3, there is depicted an electronic keyboard A according to a preferred embodiment of the present invention. Keyboard A specifically comprises a Touchtone-type embodiment particularly adapted for use in Touchtone telephones and the like. Initially, it is important to note that the electronic keyboard according to the present invention may be embodied in a virtually limitless variety of formats and configurations, suitable for use in diverse applications, including electronic calculators, typewriters, data processing equipment and the like. Thus, the Touchtone-type keyboard is described herein for illustrative purposes only, it being understood that the number and arrangement of key-representing contacts, and the alphanumeric characters, functions or other indicia associated therewith may readily be varied to suit the particular application.

Electronic keyboard A comprises an insulative board 10, preferably of the printed circuit-type. A plurality of immobile key-representing metal contacts are provided in spaced array on the upper surface of board 10. In accordance with the preferred embodiment, there are provided twelve contacts 12, corresponding to the digits 0 through 9 and the Touchtone characters "*" and "#." As depicted in FIG. 1, the contact 12 may preferably be formed in the shape of the indicia associated with each key. The indicia may typically comprise an alphanumeric character or a symbol or small word representative of the function of the key. Thus, the contacts 12, in and of themselves, convey to the operator the character or function associated therewith.

Alternatively, uniform contacts of any desired geometric configuration, e.g. circular, may be provided and indicia may be displayed on or about the contacts by conventional means such as printing, embossing or the like.

In accordance with the preferred embodiment of the present invention, the electronic circuitry associated with the keyboard is carried on the rear surface of board 10. It is thus necessary to make electrical connection from the contacts 12 on the upper surface of the board to the electronic circuitry on the rear surface of the board. To this end, there are provided an array of rear contacts 14 on the rear surface of the board connected to contacts 12 by plated-through holes 16, which are preferably capped or sealed by contacts 12 to provide a continuous front surface on board 10, substantially impervious to moisture and dirt.

The electronic circuitry of the keyboard is preferably formed in one or more integrated circuits carried on the rear surface of board 10. According to the preferred Touchtone keyboard embodiment, three integrated circuits are provided. Specifically, there are two integrated circuits 18, each of which contains the necessary circuitry to detect the contacting of any of six of the contacts 12 and to produce a logic signal in response thereto. These signals are applied to a voltage-to-frequency convertor integrated circuit 20, which produces the conventional Touchtone frequency signals associated with the various characters. The Touchtone keyboard embodiment of the present invention may thus produce the conventional frequency encoded Touchtone signals suitable for transmission. Of course, the particular encoding circuitry employed may be varied to suit the application. It is important to note, however, that such encoding circuitry may be incorporated into the electronic keyboard of the present invention.

As depicted in FIGS. 2 and 3, integrated circuits 18 and 20 may typically be of the so-called 16-lead flat-pack variety. The leads thereof may thus be readily interconnected to the rear contacts 14 by an array of printed circuit traces 22 (depicted in phantom in FIG. 2) provided on the rear surface of board 10.

Connection of the power to, and output from, keyboard A may be accomplished by a printed circuit edge connector 24 formed on one edge of board 10. According to the preferred embodiment, only three electrical connections are required to the keyboard A for the supply of power, output and a common reference for both. Thus, only three contacts are required on edge connecter 24. To provide an edge connecter 24 of high reliability, three contacts 26 having a substantially greater size than conventional printed circuit edge connecter contacts are provided on each side of board 10. Corresponding contacts 26 on each side of the board 10 are connected in parallel by plated-through holes 28. Each of the three male contacts thus formed will mate with a plurality of female contacts on a conventional printed circuit edge connecter. Such duplication of the female contacts enhances the reliability of the edge connecter 24.

Accordingly, it is apparent that the preferred embodiment of the present invention comprises a Touchtone keyboard of a simple, compact and highly reliable mechanical configuration. Moreover, it is apparent that the electronic keyboard A may readily be fabricated in accordance with conventional printed circuit techniques and processes. A relatively small number of manufacturing steps are involved, and many of these steps are readily capable of automation.

Figure 4:
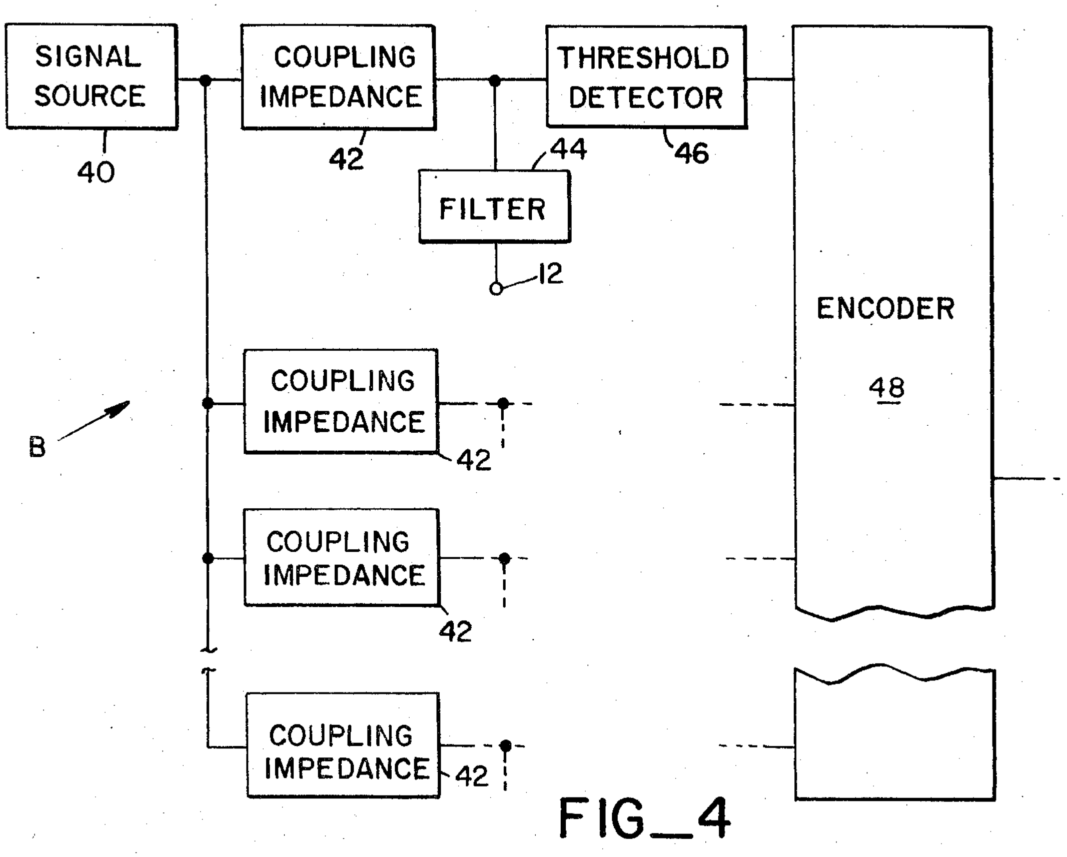
FIG. 4 is a block diagram of a preferred embodiment of the electronic circuitry of the keyboard according to the present invention.

Referring now to FIG. 4, the electronic circuitry of the keyboard according to the present invention will now be described in detail. Specifically, there is depicted electronic circuitry B which comprises the electronic circuitry employed to detect the touch of the operator's finger on any of a plurality of the key-representing contacts 12, and to produce Touchtone encoded signals in response thereto. Thus, electronic circuitry B may generally comprise the electronic circuitry contained in the integrated circuits 18 and 20 referred to briefly hereinbefore.

Electronic circuitry B comprises a single signal source 40 adapted to produce a high frequency alternating current electrical signal for application to a plurality of the keyrepresenting contacts 12. The waveform of signal source 40 is of no great consequence to the present invention and may thus typically comprise a square wave signal produced by a free-running or astable multi-vibrator. Of course, a sinusoidal signal, as would be produced by other conventional oscillator circuits, may alternatively be employed. The frequency of the signal produced by signal source 40 is, however, of great import to the operation of electronic circuitry B, as will be described in greater detail hereinafter.

The output of signal source 40 is connected to the inputs of a plurality of coupling impedances 42, there being a coupling impedance 42 associated with each of the contacts 12 to be energized by the signal source 40. Individual coupling impedances 42 are employed for each contact 12 to provide the necessary degree of electrical isolation between the various contacts 12, and to thus eliminate interaction therebetween. The coupling impedances 42 additionally function to provide a large impedance for the high frequency signal which minimizes the generation of electrical interference. The value of the coupling impedance is also of great import to the successful operation of electronic circuitry B, as will be described in greater detail hereinafter.

The output of each of the coupling impedances 42 is applied to a contact 12. While contact 12 may be directly connected to coupling impedance 42, it is preferable to connect contact 12 to coupling impedance 42 via a filter 44. Filter 44 may typically comprise a simple capacitive high pass filter, such as a small capacitor, to isolate the contact 12 from DC leakage buildup. Moreover, the impedance of filter 44 at 60 Hz should be relatively high to minimize the coupling of the 60 Hz signal induced in the body of the operator into the circuitry B. Substantial immunity from the 60 Hz signal induced in the body of the operator is thus achieved. Filter 44 may alternatively comprise a band pass filter adapted to conduct signals only of the approximate frequency of signal source 40. Use of such a band pass filter will provide improved immunity from spurious signals of higher or lower frequency.

It is important, however, that the impedance of filter 44 at the frequency of signal source 40 be relatively small in comparison to coupling impedance 42. Specifically, operation of electronic circuitry B depends upon the reduction of the high frequency signal at the output of the coupling impedance 42 when the circuit is loaded by the conductive contact of the operator's finger on contact 12, the body of the operator acting as a large, free body energy absorber to dissipate the signal. Thus, when conductive contact is made, there will be a signal division through coupling impedance 42 and filter 44, thereby reducing the signal level at the output of coupling impedance 42. If the impedance of filter 44 is small in relation to the coupling impedance 42, this reduction in signal level will be substantial and thus easily capable of error free detection.

In order to detect the reduction in signal level caused by the conductive contact of the operator's finger, the output of coupling impedance 42 is also connected to the input of a threshold detector 46. Threshold detector 46 is thus adapted to electronically switch in response to a reduction in input signal level. It is essential that the input impedance of threshold detector 46 be relatively high in comparison to the coupling impedance 42, to prevent loading of the signal at the output of coupling impedance 42. Most of the high frequency signal will thus be developed at the output of coupling impedance 42, to maximize the reduction in signal level produced by the loading of the circuit by the conductive contact of the operator's finger, and thereby facilitate error free detection of this signal level change.

The electronic switching action of threshold detector 46 may be directly employed to energize circuitry to be associated with the keyboard. Alternatively, the electronic switching action of threshold detector 46 may be employed to produce a logical signal for further electronic processing. Specifically, in accordance with the preferred or Touchtone keyboard embodiment of the present invention described in detail herein, the outputs of a Touchtone logical encoder 48. Encoder 48 functions to produce the conventional Touchtone frequency controlling logic signals in response to the logical signal levels of the threshold detectors 46, and thus in response to the particular contact 12 touched by the finger of the operator.

As referred briefly hereinbefore, the operation of electronic circuitry B is dependent upon both the frequency of the signal produced by signal source 40 and the value of coupling impedance 42. Specifically, applicant has found that the mathematical product of the frequency times the coupling impedance produces a term indicative of the operation thus described. Specifically, if the product of the frequency and coupling impedance is too high, the mere proximity of the operator's finger to one of the contacts 12 may be sufficient to reduce the signal level at the output of coupling impedance 42 sufficiently to actuate threshold detectors 46. Such proximity operation tends to inadvertently produce spurious responses and is thus highly undesirable. On the other hand, if the product of the frequency and coupling impedance is too low, the operation of the circuitry B may become influenced by the body of the operator as a signal source of 60 Hz induced in the operator's body. Such dependence would tend to reduce the accuracty of the keyboard due to the wide variation in the signal level produced by the operator of the body, and is thus also highly undesirable.

Accordingly, applicant has determined a preferred range for the product of the frequency of signal source 40 and the impedance of coupling impedance 42 of from about $2 \times 10^{9}$ Hertz-ohms to about $50 \times 10^{9}$ Hertz-ohms. Applicant has found that by selecting these parameters within the stated range, operation of electronic circuitry B will require the operator's finger to conductively contact the contact 12, while rendering the circuit independent and immune from the 60 Hertz signal induced in the body of the operator. Typically, the frequency of signal source 40 may be approximately 50 kilohertz, the value of coupling impedance 42 being selected so that the product falls within the state range. The 50 kilohertz signal minimizes the effects of the little radio frequency interference produced, since it falls in a substantially unused portion of the spectrum.

It is thus apparent that the electronic keyboard circuitry B according to the present invention provides an immobile keyboard advantageously responsive solely to conductive contact by the operator's finger, rather than proximity action, with substantial immunity to the 60 Hz induced in the body of the operator and other spurious signals. Since the circuitry in not dependent upon the 60 Hz signal induced in he body of the operator, it is thus highly suitable for portable equipment such as electronic calculators and the like, which may be operated remote from 60 Hz sources. Moreover, the circuitry B possesses a relatively fast response and is highly accurate and error free.

As referred to briefly hereinbefore, the electronic circuitry B may readily be embodied in integrated circuitry. Thus, with specific reference to FIG. 5, a particular embodiment of electronic circuitry B which may be readily embodied in an integrated circuit will now be described in detail.

Signal source 40 preferably comprises a free-running or astable multi-vibrator. Specifically, there are provided a pair of transistors 60 in common-emitter configuration, with a collector load resistor 62 and a base bias resistor 64 for each of the transistors 60. Two capacitors 66 are provided respectively interconnecting the collector of one of the transistors 60 with the base of the other transistor 60 to produce a conventional free-running or astable multi-vibrator. The output of signal source 40 is thus taken at the collector of one of the transistors 60 and comprises a square wave signal swinging approximately from ground to the supply voltage.

Coupling impedance 42 comprises a resistor 68 in parallel with a diode 70. As referred to briefly hereinbefore, filter 44 may comprise a simple high pass filter. Specifically, in accordance with this embodiment, filter 44 comprises a capacitor 72 of a suitable value to provide a relatively small impedence at the frequency of signal source 40, in comparison to coupling impedance 42.

Diode 70 of coupling impedance 42 functions to maximize the reduction signal level produced by the loading of the signal by the conductive contact of the operator's finger. Specifically, the signal at the output of coupling impedance 42 swings approximately from ground to the positive supply voltage absent the contact of the operator's finger, as referred to hereinbefore. Absent diode 70, the loading of the signal by the conductive contact of the operator's finger, as a large free body capacitance, would cause filter capacitor 72 to charge to a value generally intermediate ground and the positive supply voltage. Diode 70 functions to discharge filter capacitor 72 in this mode, to an approximate ground level. Specifically, when the signal at the output of signal source 40 swings downwardly, a low impedance path through diode 70 is provided to discharge capacitor 72. On the upswing, capacitor 72 views a higher coupling impedance 42, to minimize recharging. Thus, diode 70 functions to reduce the signal level at the output of capacitor 72 to approximately ground level when the operator's finger makes conductive contact with contact 12. The reduction in signal level caused by the conductive contact of the operator's finger is thus maximized, to facilitate error-free detection thereof.

Threshold detector 46 comprises a transistor detector stage followed by an avalanche switch. Specifically, the output of coupling impedance 42 is connected to the base of a transistor 74. The collector transistor 74 is connected to the positive supply voltage and a capacitor 76 is connected from the emitter of transistor 74 to ground. Transistor 74 and capacitor 76 thus form a simple transistor detector having an input impedence sufficiently high to prevent the loading of the signal at the output of coupling impedance 42.

The detected signal at the emitter of transistor 74 is applied, via a resistor 78, to the input of an avalanche switching circuit 80. Avalanche switch 80 may comprise any conventional transistor switching circuit having avalanche gain and responsive to the output of transistor 74, such as a Schmitt trigger or the like. A degree of hysteresis is desirable to make the operation more positive.

Figure 5:
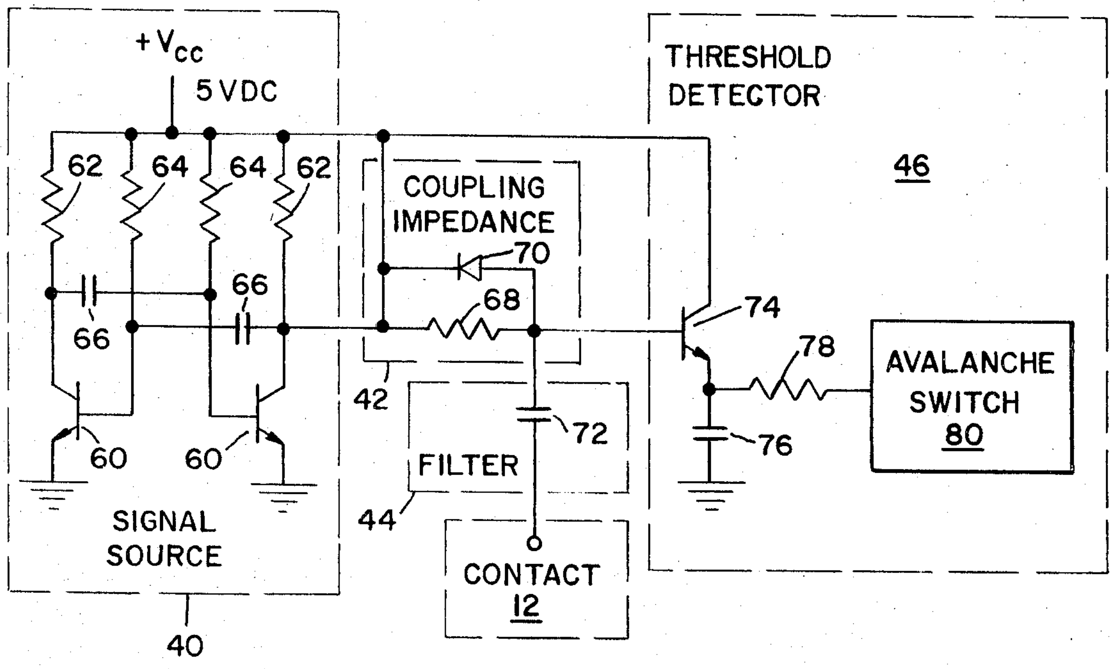
FIG. 5 is a schematic diagram of an embodiment of the electronic circuitry depicted in FIG. 4.

Applicant has successfully constructed the circuitry depicted in FIG. 5, employing the following values for the components, which are presented herein for illustrative purposes:

Resistors 61, 10K ohms
Resistors 64, 330K ohms
Capacitors 66, 15 pf.
Resistors 68, 330K ohms
Capacitor 72, 30 pf.
Capacitor 76, 30 pf.
Resistors 78, 330K ohms It is thus apparent that all of the components of the electronic circuitry depicted in FIG. 5 may have values compatible with the silicon planar process for manufacturing integrated circuits. Thus, the circuitry depicted in FIG. 5 may be incorporated into an integrated circuit. Integrated circuits manufactured in accordance with the silicon planar process are of high reliability and possess an extremely long life expectancy, thereby enhancing the reliability and life expectancy of the electronic keyboard according to the present invention.

Figure 6:
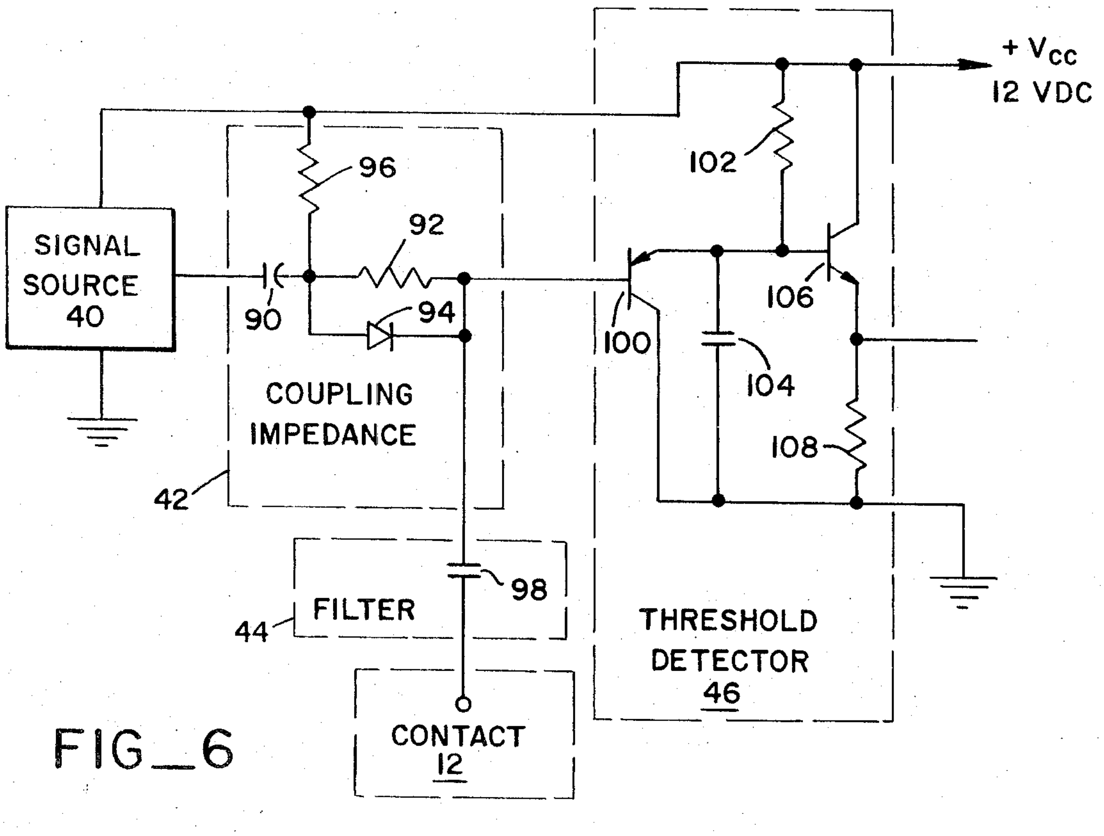
FIG. 6 is a schematic diagram, similar to FIG. 5, of an alternative embodiment of the electronic circuitry depicted in FIG. 4.

Electronic circuitry B according to the present invention may, of course, be embodied in discrete components. Referring specifically to FIG. 6, an embodiment of electronic circuitry B employing a minimum of components, and thus particularly well suited for implementation in discrete components, will now be described in detail. Signal source 40 is depicted in block form in FIG. 6 as it preferably comprises a free-running or astable multi-vibrator substantially identical to that described with respect to the embodiment depicted in FIG. 5.

Coupling impedance 42 includes a coupling capacitor 90 which functions to AC couple the high fequency signal from signal source 40 to the coupling impedance. The coupling impedance 42 further comprises a resistor 92 in parallel with a diode 94. A resistor 96 is connected from the positive voltage supply to the junction of capacitor 90, resistor 92 and diode 94. Resistor 96 functions to bias the AC coupled high frequency signal to the supply voltage, or, in other words, to rereference the high frequency signal to swing about the supply voltage. The thus described circuitry of coupling impedance 42 of the novel avalanche detector to be described hereinafter. Filter 44 comprises a small capacitor 98 corresponding to capacitor 72 described with respect to the embodiment depicted in FIG. 5.

In accordance with this embodiment of electronic circuitry B, a novel avalanche threshold detector 46, employing a minimum of components, is provided. Specifically, the output of coupling impedance 42 is connected to the base of a transistor 100. The collector of transistor 100 is grounded, and the emitter thereof is coupled to the positive supply voltage through a load resistor 102. A capacitor 104 is connected across the emitter and collector of transistor 100. Transistor 100, resistor 102, and capacitor 104 thus form a detector circuit. The interconnection capacitor 104 and transistor 100 may be arranged, however, in other detector configurations.

The detector thus formed exhibits avalanche gain due to the interaction the coupling impedance 42 and the detector to form a feedback path. Specifically, when the emitter-base junction of transistor 100 is conducting in reverse breakdown, capacitor 104 will discharge thru the emitter-base junction of transistor 100 and diode 94 into capacitor 90. A feedback signal maintaining transistor 100 in conduction will thus be stored in capacitor 90. Reduction of the signal level at the base of transistor 100, caused by the contact of the operator's finger on contact 12 will cause transistor 100 to assume a nonconducting state, wherein the feedback signal is insufficient to cause breakdown.

In greater detail, the first negative swing of the signal at the output of coupling impedance 42 will cause transistor 1oo to conduct and discharge capacitor 104 to a value approximately equal to one-half of the supply voltage plus one volt. As the signal at the base of transistor 100 swings positive again, the emitter-base junction of transistor 100 will become a dynamic short in reverse breakdown. The reverse breakdown of transistor 100 will discharge capacitor 104 through the emitter-base junction of transistor 100 and diode 94 into coupling capacitor 90, thereby charging capacitor 90 to a lower voltage. The value of capacitor 104 is selected to be much larger than the value of capacitor 90, so that the voltage change across capacitor 104 will be much smaller than the voltage change across capacitor 90 when capacitor 104 discharges into capacitor 90 in the aforementioned manner. When the signal at the base of transistor 100 swings negative again, the downward excursion will be greater because of the new reference placed on capacitor 90. This, in turn, will cause the reverse breakdown of transistor 100 to discharge capacitor 104 further. This process will be repeated until capacitor 104 is almost discharged. Transistor 100 will thus be maintained in conduction.

When the operator's finger makes conductive contact with contact 12, filter capacitor 98 will short the signal at the base of transistor 100 to the operator's body, causing the signal level at the base of transistor 100 to be drastically reduced. Transistor 100 will then assume a non-conducting state, causing capacitor 104 to be charged, through resistor 102, to approximately the supply voltage. Transistor 100 will thus assume a nonconducting state in response to the signal reduction caused by the contact of the operator's finger. It is thus apparent that avalanche detection is accomplished by a single transistor 100 and associated circuitry.

Applicant has found that the successful operation of the thus described one transistor avalanche detector requires the reverse breakdown voltage of transistor 100 to be within certain limits. Specifically, it is essential that the reverse breakdown voltage of transistor 100 be between one-half of the supply voltage plus 1 volt and the supply voltage minus 1 volt. If the reverse breakdown voltage of transistor 100 is greater than the specified range, reverse breakdown could not occur, thereby prohibiting the avalanche gain. On the other hand, if the reverse breakdown voltage of transistor 100 is less than the specified range, the reduction in voltage at the base of transistor 100 caused by the contact of the operator's finger would be insufficient to bias transistor 100 out of conduction.

It is thus apparent that the threshold detector 46 thus described achieves the desired avalanche gain with a minimum of circuit components. Threshold detector 46 may further include a transistor 106 in an emitter-follower configuration with a resistor 108 as an emitter resistor. Transistor 106 and resistor 108 form an output buffer for the thus described threshold detector. Alternatively, transistor 106 and resistor 108 may be omitted, and the current through resistor 102 may be directly sensed to provide the output.

Applicant has successfully constructed the thus described circuitry employing the following component values, which are presented herein for illustrative purposes only:

Capacitor 90, 100 pf.
Resistor 92, 100K ohms
Resistor 96, 1 Megohm
Capacitor 98, 100 pf.
Resistor 102, 100K ohms
Capacitor 104, 1000 pf.
Resistor 108, 10K ohms Particular power supply and transistor polarities have been depicted in FIGS. 5 and 6 for illustrative purposes only. It is to be expressly understood that the circuitry may be constructed with other power supply and/or transistor polarities.

While particular embodiments of the present invention have been shown and described in detail, it is apparent that adaptations and modifications will occur to those skilled in the art, such adaptations and modifications being within the spirit and scope of the present invention, as set forth in the claims.

What is claimed is:

1. A solid state keyboard comprising a plurality of conductive terminals, signal source means for generating a high frequency signal, coupling impedance means connected to each of said terminals for applying said signal to said terminals and sensing means for each of said terminals for sensing a reduction in signal level at the output of said coupling impedance means, the product of the frequency of said signal and the impedance of said coupling impedance means being from about 2 $\times$ 10$^9$ Hertz-ohms to about 50 $\times$ 10$^9$ Hertz-ohms so that conductive contact of the operator's finger on said terminal is required to reduce the signal level sufficiently to actuate said sensing means.

2. Apparatus according to claim 1 comprising an insulative board carrying said terminals on one side thereof, said signal source means and said sensing means comprising electronic circuit means having an array of printed circuit traces on the other side of said board and conductive means electrically connecting said terminals and said printed circuit traces.

3. Apparatus according to claim 2, wherein said terminals are formed in the shape of an indicia representative of the function associated with said terminal.

4. Apparatus according to claim 2, wherein said electronic circuit means comprises at least one integrated circuit carried on said other side of said board.

5. Apparatus according to claim 1, further comprising filter means in series with each of said terminals for conducting said signal to said terminals while substantially blocking the conduction of D.C. and 60 Hz from said terminals to said sensing means.

6. Apparatus according to claim 5, wherein said filter means comprises a capacitor.

7. Apparatus according to claim 5, wherein the impedence of said filter means at the frequency of said signal is substantially lower than the impedance of said coupling impedance means.

8. Apparatus according to claim 5, wherein the input impedance of said sensing means is substantially higher than the impedance of said coupling impedance means.

9. Apparatus according to claim 5, wherein each of said coupling impedance means comprises dual impedance means having a lower impedance for current flow in one direction and a higher impedance for current flow in the other direction.

* * * * *